United States Patent [19]
Darmon et al.

[11] Patent Number: 5,329,536
[45] Date of Patent: Jul. 12, 1994

[54] METHOD AND APPARATUS FOR SEQUENTIALLY DECODING A DIGITAL STREAM ENCODED BY A CONVOLUTION TYPE ERROR-CORRECTING CODE

[75] Inventors: Marc Darmon, Paris; André Bazet, Clichy; Pascal Brelivet, Paris, all of France

[73] Assignee: Alcatel Transmission par Faisceaux Hertziens A.T.F.H., Lavallois Perret Cedex, France

[21] Appl. No.: 676,489

[22] Filed: Mar. 28, 1991

[30] Foreign Application Priority Data

Mar. 30, 1990 [FR] France ................. 90 04090

[51] Int. Cl.⁵ .............. G06F 11/10; H03M 13/12
[52] U.S. Cl. ........................... 371/43; 371/46
[58] Field of Search ............ 371/43, 44, 45, 46

[56] References Cited

U.S. PATENT DOCUMENTS

| | | | |
|---|---|---|---|
| 4,539,684 | 9/1985 | Kloker | 371/46 |
| 4,710,746 | 12/1987 | Shimoda | 371/43 X |
| 4,797,887 | 1/1989 | Yamasaki et al. | 371/43 |
| 4,878,221 | 10/1989 | Shimada | 371/46 X |
| 4,910,786 | 3/1990 | Eichel | 382/22 |
| 5,079,771 | 1/1992 | Shimada | 371/43 |

OTHER PUBLICATIONS

IEEE Transactions On Communications, vol. CO-M-32, No. 2, Feb. 1984, pp. 169-176, IEEE, New York, USA; J. B. Anderson et al.: "Sequential coding algorithms: A survey and cost analysis".

International Conference On Communications, Toronto, Jun. 4-7, 1978, vol. 2, pp. 34.1.1-34.1.4, IEEE, New York, USA; J. B. Anderson et al: "A push-down stack measure of encoding algorithm complexity".

IBM J. Res. Develop., vol. 13, No. 6, Nov. 1969, pp. 675-685; F. Jelinek: "Fast sequential decoding algorithm using a stack".

Primary Examiner—Robert W. Beausoliel, Jr.
Assistant Examiner—Glenn Snyder
Attorney, Agent, or Firm—Sughrue, Mion, Zinn, Macpeak & Seas

[57] ABSTRACT

A method and apparatus for sequential decoding using the stack algorithm. A stack is used which is small in size and which has a leaky bottom. A counter stores the total count of nodes observed so as to abandon decoding if this count exceeds a fixed value. A comparator continuously compares the metric at the top of the stack with the largest metric lost from the bottom of the stack as stored in a memory. A small memory stores the path scanned through the logic tree, thereby directly providing the decoded block.

6 Claims, 2 Drawing Sheets

METHOD AND APPARATUS FOR SEQUENTIALLY DECODING A DIGITAL STREAM ENCODED BY A CONVOLUTION TYPE ERROR-CORRECTING CODE

The present invention relates to a method and to apparatus for sequentially decoding a digital stream encoded by a convolution type error-correcting code.

BACKGROUND OF THE INVENTION

Digital transmission, and in particular radio beam transmission, is frequently subjected to interference, usually involuntary interference, which gives rise to errors in the received stream. Therefore, in order to recover the information in spite of interference, it is practically essential to encode the stream to be transmitted by means of an error-correcting code, and to decode the received stream by means of an error-correcting decoder.

The error-correcting codes that are the most widespread at present are block codes and convolution codes.

Block codes are simpler and consist of adding a determined number of redundancy bits to each block of bits to be transmitted. These are low performance codes and they cannot be used for messages that run the risk of a high level of interference.

Convolution codes are much more complex, but they also provide much better performance. They cause an initial stream to be transmitted to correspond to a stream which is actually transmitted in which the number of bits is multiplied by a given factor n, e.g. a factor of 2 or a factor of 3, with each group of n bits created in this way for each initial bit depending on the preceding groups.

There are two techniques in general use for error-correcting decoding of digital streams encoded by a convolution type code:

A first technique is to use the Viterbi algorithm which consists in examining all possible cases over a very large number of cases and then in selecting the most probable case. This algorithm is optimal, but it is complex to implement.

A second solution is to use "sequential decoding" which is less than optimal but which, in contrast, is quicker and simpler to implement, particularly for complicated codes. The complexity of the sequential algorithm does not increase with code performance, and it is therefore suitable for decoding high performance codes.

Two algorithms and their variants are in general use for performing sequential decoding: the stack algorithm, and the FANO algorithm which is now somewhat outdated.

In the stack algorithm, decoding is performed in blocks (e.g. blocks of 1000 bits), and it consists in establishing a "path" through a binary "logic tree" which is a representation of the decoding, each node of the tree being defined by a depth representative of its distance from the root node of the tree, and possessing, for the bit stream under consideration, a probability defined by a numerical value called the "metric". Observed nodes are then placed in an ordered stack with the highest-metric node being extended each time by its two successors.

More precisely, for each group of received code bits in the transmitted stream corresponding to a single bit prior to encoding:
 the node at the top of the stack is removed;
 the metrics of the two nodes following this node are then calculated;
 they are placed in the stack; and
 the stack is finally sorted by nodes of decreasing metric.

When the limiting size of the stack is exceeded (i.e. when the stack overflows), the block is declared badly received and is not decoded. A request may then be made for the block to be retransmitted, or else it may be considered as being lost. Typically, the maximum size of the stack lies in the range one to ten times the number of bits in a block to be decoded. The smaller the stack the larger the number of blocks that will not be decoded (the stack will overflow often), and the larger the stack the larger the number of blocks that will be decoded with the risk of erroneously decoding blocks that have been very badly received.

The main drawbacks of stack decoding are the following: a large stack is required (stack depth is typically between one and ten times the size of blocks to be decoded, and thus between 1000 and 10,000 if 1000-bit blocks are being decoded); sorting the stack by increasing order of node metric is slow (yet the stack must be sorted each time a new node is scanned, thus between one and ten times per decoded bit); and once a block has been decoded, it is necessary to perform a trace-back in order to determine which block was, in fact, transmitted. These drawbacks make it very difficult to provide a practical implementation of such a decoder because of its size and because of the large amount of processing per decoded bit which limits its speed. In existing implementations, the stack is implemented using random access memory (RAM) which is sorted each time a node is scanned.

The invention seeks to remedy these drawbacks and to make it possible to implement such a sequential decoder at reduced cost in size and in components, and capable of operating at a high rate.

SUMMARY OF THE INVENTION

To this end, the present invention provides a method and apparatus for sequentially decoding a digital stream encoded by a convolution type error-connecting code, said sequential decoding making use of the stack algorithm, and the method consisting in using a stack having a leaky bottom (and thus losing lowest-metric nodes as and when other nodes enter the top of the stack in accordance with the stack algorithm), the stack advantageously being very small, with it being possible to use a stack of less than 100 cells, for example, regardless of block size, while simultaneously storing the total count of nodes observed in accordance with the stack algorithm during block decoding: if this count exceeds a limit value fixed in advance and typically lying between one and ten times the size of a block, then that indicates that decoding of the block is to be abandoned.

BRIEF DESCRIPTION OF THE DRAWINGS

An embodiment of the invention is described by way of example with reference to the accompanying drawings, in which.

DETAILED DESCRIPTION

Figure 1:
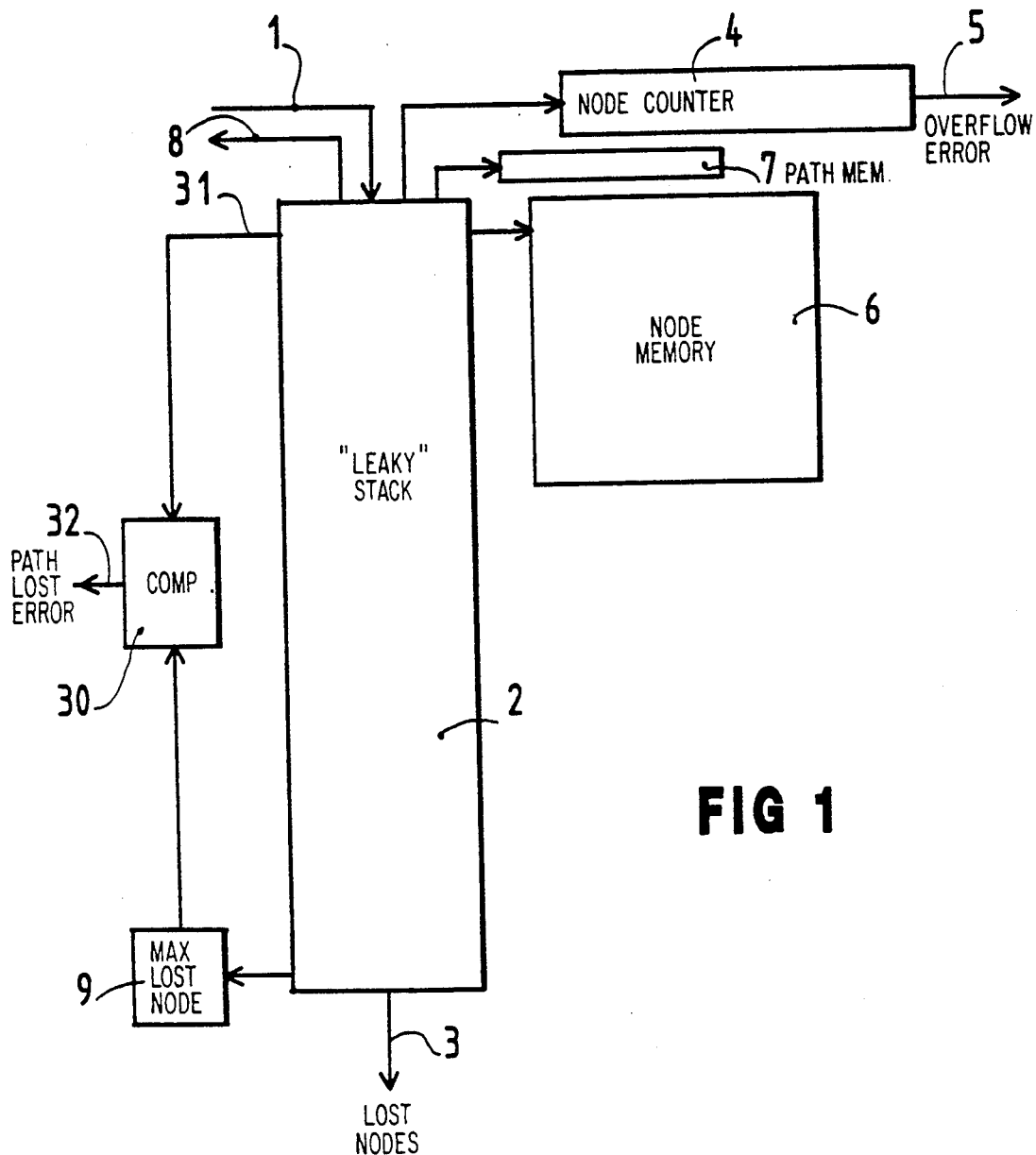
FIG. 1 is a block diagram for explaining the operation of the decoding apparatus.

With reference to FIG. 1, the received digital stream 1 which has been encoded using a convolution type code is applied to a stack 2 in accordance with the general principles of sequential decoding using the stack algorithm. According to the invention, the stack 2 is both "leaky" at its bottom, i.e. it loses lowest-metric nodes from its bottom 3 as and when other nodes are added to the top of the stack at 1, and it is advantageously very small in size, said size being totally independent of the size of the blocks to be decoded. Typically, the size of the stack 2 is less than 100 cells, e.g. the stack may be constituted by 40 cells.

For a given block, the total count of nodes observed in performing the stack algorithm is stored in a counter 4 whose overflow output at 5 constitutes a decision signal for abandoning decoding of the block in question. The counter overflows at a limit number which is fixed in advance and which typically lies between one and ten times the size of a block.

Since only the lowest-metric nodes are lost at 3 (with the stack 2 being sorted in application of the stack algorithm on each occasion, and with the scanned node being conventionally removed at 8), the performance of such apparatus is equivalent to the performance of conventional apparatus which retains all of the observed nodes and which requires a stack constituted by a series of 1000 to 10,000 cells for use with received blocks having a size of 1000 bits, for example.

In conventional manner, the set of nodes scanned and put into the stack 2 is stored in a memory 6 together with the depths of these nodes in the logic tree and the transitions (0 or +1) corresponding thereto. Advantageously, it is assumed that even order nodes correspond to a zero transition, for example, and that odd order nodes correspond to a +1 transition, for example. As a result, there is no need to store the transition corresponding to each node since this transition is given by the least significant bit (LSB) of the binary number of the node.

Further, it is also advantageous to use another memory 7 to store the scanned path in the tree, with the memory 7 being very small (e.g. containing about one thousand bits for blocks of about 1000 bits). Thus, once decoding has terminated, i.e. when a node situated at the end of the logic stream has just been scanned, then the scanned path (i.e. the decoded block) is directly available from the memory 7 and there is therefore no need to perform a conventional trace-back through the logic tree.

Advantageously, in order to avoid the very low risk of losing a node at 3 that in fact leads to an optimum path, it is advantageous to provide a memory 9 for storing the maximum metric of the nodes lost at 3 and a comparator 30 for verifying on each occasion that this maximum lost metric is not greater than the metric extracted at 31 to be extended by its two successors. If ever this maximum metric lost at 3 is greater than the metric at the top of the stack (at 31), then it is highly likely that the optimum path has been lost, and as a result the signal delivered at the output 32 from the comparator 30 constitutes, like the signal at 5, a signal representative of a decoding failure. (This increases the number of blocks for which decoding fails by a very small amount, with the increase being too small to be significant, being less than $10^{-4}\%$, for example, if more than 40 cells are retained.)

The leaky stack 2 may naturally be implemented conventionally by using RAM. However, an advantageous form of the invention consists in implementing the leaky stack with its sorting function and its function of ejecting the contents of the top cell at 8 by means of a novel digital data storage and sorting apparatus which is now described with reference to FIGS. 2 and 3.

Figure 2:
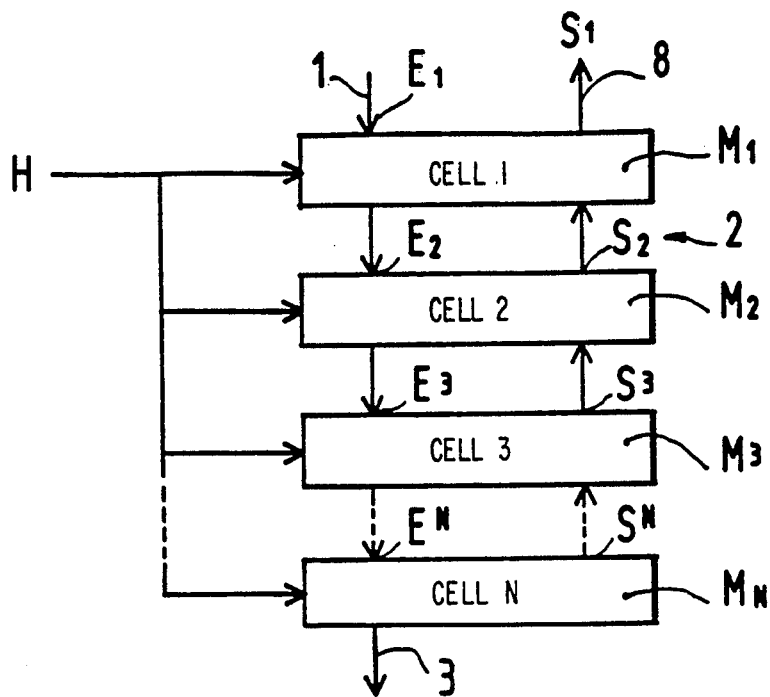
FIG. 2 is an overall block diagram of a leaky stack as used in the apparatus.

With reference to FIG. 2, the apparatus 2 comprises a descending series of identical modules or cells M1, M2, M3, ..., Mn which are connected in cascade and which are synchronized by a common clock H. It thus constitutes a "systolic" stack, i.e. a stack made up of a series of identical modules all operating simultaneously.

Each module of the stack has an input E1, E2, E3, ..., EN, for data which generally comes from a register in the preceding module. Naturally, the input E1 of the top module M1 in the stack constituted the input 1 for new data placed on the stack.

Further, each module of the stack has an output register whose data SN, ..., S3, S2, is applied to the module above M(N-1), ..., M2, M1, with the output S1 from the module M1 at the top of the stack constituting the data output from the stack, with data leaving the stack in series and in decreasing order (i.e. largest values first), as explained below.

Figure 3:
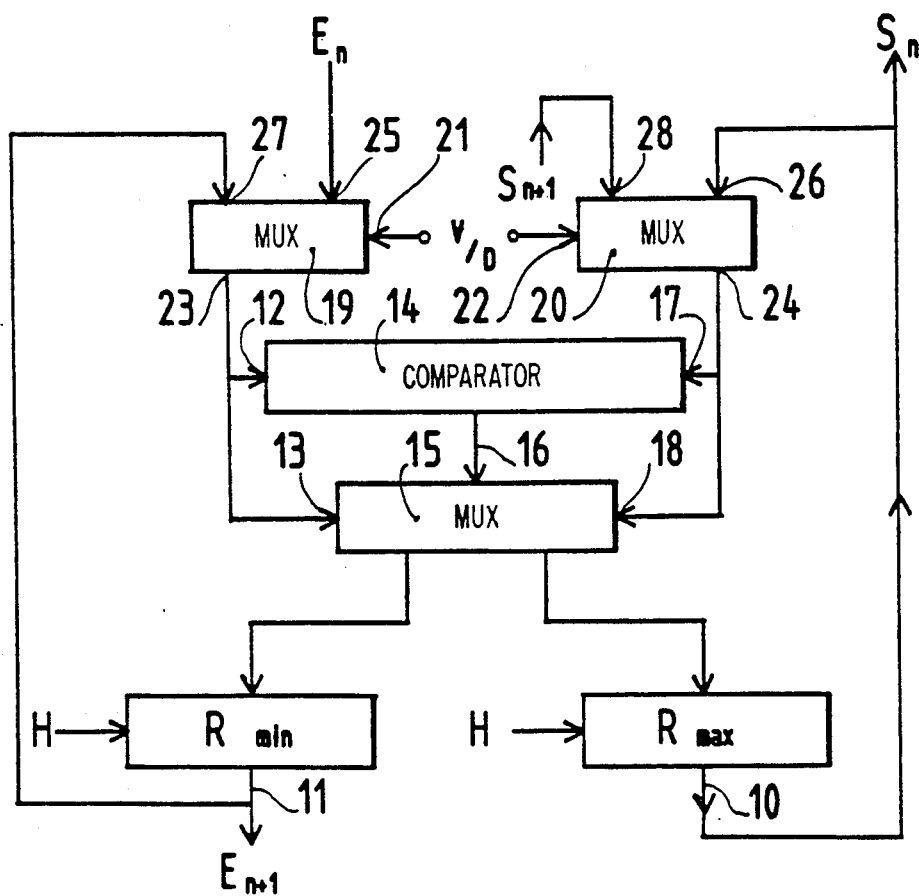
FIG. 3 shows one of the cells in the stack of FIG. 2 in greater detail.

FIG. 3 shows a module Mn, where n is an integer in the range 1 to N.

The module has two registers, both of which are synchronized by the clock H, namely a first register Rmax whose data output 10 constitutes the output Sn of the module, and a second register Rmin whose data output 11 constitutes the input E(n+1) of the next lower module M(n+1) in the stack (not shown).

Two multiplexers 19 and 20 are provided at the input to the module, the multiplexers being responsive to a DC control value U/D that they receive on respective control terminals 21 and 22 to switch their respective outputs 23 and 24 either to their righthand inputs 25 and 26 for control level D, or to their lefthand inputs 27 and 29 for control level U.

The righthand inputs 25 and 26 are respectively connected to receive the input En from the next higher module and the output Sn of the register Rmax, which output is also applied to the next higher module (see FIG. 2).

The output 11 from the register Rmin constitutes the input E(n+1) for the next lower module, and also constitutes the input to the lefthand terminal 27 of the multiplexer 19. The lefthand input terminal 28 of the multiplexer 20 receives the output S(n+1) from the next lower module.

The output 23 from multiplexer 19 is applied both to a first input 12 of a digital comparator 14 and to a first input 13 of a multiplexer 15 whose control input 16 receives the output signal from the comparator 14.

The other input 17 of the comparator 14 and the other input 18 of the multiplexer 15 both receive the output signal 24 from the multiplexer 26, with the multiplexer being configured so that the signal at 16 specifying which of the two numbers at 23 and 24 is the larger causes the larger of them to be directed to the register Rmax and the smaller to the register Rmin, while simultaneously the previous content of Rmin is transmitted via E(n+1) to the next lower stage in the stack, i.e. M(n+1).

This systolic stack operates as follows:

In position D, terminals 26 and 24 are interconnected as are terminals 25 and 23 such that outputs 23 and 24 are respectively applied to 12 & 13 and to 17 & 18.

On a pulse from the clock H, the input En is transmitted to Rmax if the contents Sn thereof is smaller, and in that case said initial contents of Rmax is transferred to Rmin while the input En is transmitted to Rmin if it is less than the contents of Rmax. In either case, the initial contents of Rmin moves to the next stage down which in turn operates simultaneously and in the same manner.

In other words, the value En applied to the input of module Mn is compared with the value Sn stored in the register Rmax of the module. The multiplexer 15 switches the lower of the two values Sn or En to the register Rmin and the higher of the two values is stored in the register Rmax. The value E(n+1) leaving the register Rmin is applied to the next lower stage M(n+1) where identical processing is performed simultaneously.

A value applied to the top of the stack via E1 thus moves progressively down the stack at the rate of the clock H through the various stages M1, M2, ..., until it is stored in the register Rmax of a module which was previously storing a lower value. On the next clock pulse, this lower value is sent to the next lower stage by the same process: larger numbers stay put while smaller numbers move down until they find their proper sorted position in the stack.

The stack constituted by the sequence of Rmax registers thus sorts itself automatically on each clock pulse. When a new value E1 is applied to the stack, it is immediately compared with the maximum value in the stack which is necessarily at the top of the stack. If it is larger, then it is stored in the register Rmax at the top of the stack. Otherwise it moves down to the next stage and a new input value E1 may be applied to the input 1.

In order to extract data from the stack, the control level is switched to U. The terminals 23 and 24 are then respectively connected to the terminals 27 and 26.

On each pulse of the clock H, the contents of the register Rmin is then compared with the output S(n+1) from the next lower module, and the larger of these two numbers is placed in Rmax while simultaneously the number Sn which used to be in Rmax is transferred to the next module up for identical processing. Each clock pulse thus causes the larger of the two numbers in the module Mn to move up to the next higher module M(n−1). The largest number in the stack thus leaves via 8 on each clock pulse, such that the data in the stack does indeed leave it in series and in decreasing order.

Naturally, the invention is not limited to the embodiment described above, and on the contrary it may be implemented under numerous equivalent forms.

We claim:

1. A method of sequentially decoding a block of a digital stream encoded by a convolution type error-correcting code, said sequential decoding making use of a stack algorithm wherein a plurality of entries are maintained in a stack with each entry corresponding to a node in a logic tree, each node having an associated metric corresponding to a probability that said node is a part of a correct decoding path through said logic tree, the nodes being stored in said stack in order according to their metric values with the node with the highest metric at the top of said stack, wherein, for each group of received coded bits corresponding to a single unencoded bit, said method comprises the steps of:

removing the node at the top of said stack;

calculating metrics of the two nodes following said removed node in said logic tree;

placing said two nodes in said stack; and sorting said stack according to metric values so that the node with the highest metric value is at the top of said stack, wherein said stack is a small-sized stack having a leaky bottom for losing the lowest-metric nodes when other nodes are added at the top of said stack, and wherein said method further comprises storing a total count of nodes observed during the decoding of a block, and determining that decoding of said block is to be abandoned upon said count exceeding a limit value which is fixed in advance and which is greater than the size of said stack, wherein said digital stream comprises a sequence of transitions of at least first and second types, the method being of the type in which all nodes which have been represented by entries in said stack during decoding of a block are stored together with their respective depths, wherein even numbered nodes are correspond to a first type of transition, e.g. zero, and odd numbered notes correspond to a second type of transition, e.g. +1, so that there is no need to store the transition corresponding to each node since said transition is constituted by the LSB of the node number.

2. A sequential decoding method according to claim 1, further comprising storing a list of said nodes removed from the top of said stack and representing a scanned path, so that when decoding is terminated by virtue of a node situated at the end of the logic tree being scanned, the decoded block is then immediately available from said stored scanned path.

3. A method of sequentially decoding a block of a digital stream encoded by a convolution type error-correcting code, said sequential decoding making use of a stack algorithm wherein a plurality of entries are maintained in a stack with each entry corresponding to a node in a logic tree, each node having an associated metric corresponding to a probability that said node is a part of a correct decoding path through said logic tree, the nodes being stored in said stack in order according to their metric values with the node with the highest metric at the top of said stack, wherein, for each group of received coded bits corresponding to a single unencoded bit, said method comprises the steps of:

removing the node at the top of said stack;

calculating metrics of the two nodes following said removed node in said logic tree;

placing said two nodes in said stack; and sorting said stack according to metric values so that the node with the highest metric value is at the top of said stack, wherein said stack is a small-sized stack having a leaky bottom for losing the lowest-metric nodes when other nodes are added at the top of said stack, and wherein, in order to avoid losing a node belonging to said correct path, said method further comprises comparing the maximum metric of the lowest-metric nodes lost by said stack during decoding of said block with the metric of said node removed from said top of said stack, and determining that decoding of said block is to be abandoned upon said maximum metric being greater than said metric of said node removed from said top of said stack.

4. A sequential decoding method according to claim 3, wherein said digital stream comprises a sequence of transitions of at least first and second types, the method being of the type in which all nodes which have been represented by entries in said stack during decoding of a block are stored together with their respective depths, wherein even numbered nodes are correspond to a first type of transition, e.g. zero, and odd numbered nodes correspond to a second type of transition, e.g. +1, so that there is no need to store the transition corresponding to each node since said transition is constituted by the LSB of the node number.

5. A sequential decoding method according to claim 3, further comprising storing a list of said nodes removed from the top of said stack and representing a scanned path, so that when decoding is terminated by virtue of a node situated at the end of the logic tree being scanned, the decoded block is then immediately available from said stored scanned path.

6. In a decoder for sequentially decoding a block of a digital stream encoded by a convolution type error-correcting code, said sequential decoding making use of a stack algorithm wherein a plurality of entries are maintained in a stack with each entry corresponding to a node in a logic tree, each node having an associated metric corresponding to a probability that said node is a part of a correct decoding path through said logic tree, the nodes being stored in said stack in order according to their metric values with the node with the highest metric at the top of said stack, wherein, for each group of received coded bits corresponding to a single unencoded bit, the node at the top of said stack is removed, metrics of the two nodes following said removed node in said logic tree are calculated, said two nodes are placed in said stack, and said stack is sorted according to metric values so that the node with the highest metric value is at the top of said stack, wherein said stack is a small-sized stack having a leaky bottom for losing the lowest-metric nodes when other nodes are added at the top of said stack, and wherein said decoder further comprises means for storing a total count of nodes observed during the decoding of a block, and means for determining that decoding of said block is to be abandoned upon said count exceeding a limit value which is fixed in advance and which is greater than the size of said stack, said stack comprising a systolic stack constituted by a cascade of identical cells synchronized by a common clock signal, each of said cells comprising:

a first register to which said clock signal is applied;

a second register to which said clock signal is also applied;

a comparator for receiving firstly the data contained in the first register and secondly the input digital data to the cell, which input data comes either from the next cell above or else, in the case of the top cell in the stack, constitutes external data input to the stack;

a multiplexer receiving two data inputs and controlled by the output signal from said comparator in such a manner as to direct the greater of the two input values to the first register to replace the data value therein, and to direct the smaller of the two input values to the second register to replace the value therein, with said value that was in the second register being transferred to the next lower cell where it constitutes the input digital data; and two multiplexers controlled by a common signal which, in a first position direct said data input and the contents of the first register to the comparator, to store and sort the data as before, whereas in a second position they direct both the contents of the second register and the contents of the first register of the next lower cell to the comparator such that on each clock pulse the larger number in the cell moves up to the next cell above and consequently the data leaves the stack in series and in decreasing order.

* * * * *